United States Patent [19]

Sczepaniak et al.

[11] 3,974,043
[45] Aug. 10, 1976

[54] MAKING A STABILIZED SUPERCONDUCTOR

[75] Inventors: Werner Sczepaniak, Windeck; Werner Materne, Opsen, both of Germany

[73] Assignee: Kabel-und Metallwerke Gutehoffnungshutte Aktiengesellschaft, Hannover, Germany

[22] Filed: Apr. 25, 1975

[21] Appl. No.: 571,694

[30] Foreign Application Priority Data

Mar. 27, 1974 Germany............................ 2414744

[52] U.S. Cl............................... 204/29; 204/37 R; 204/38 B
[51] Int. Cl.² ........................ C25D 5/34; C25D 5/50
[58] Field of Search ................. 204/37 R, 38 B, 29, 204/37 T, 40, 27, 28

[56] References Cited

UNITED STATES PATENTS

| 1,543,237 | 6/1925 | Sonoda ............................ 204/37 R |
| 3,328,271 | 6/1967 | Kneip, Jr. et al. .................... 204/40 |
| 3,866,315 | 2/1975 | Ziemak ............................ 204/38 B |

FOREIGN PATENTS OR APPLICATIONS

| 47-10821 | 3/1972 | Japan................................ 204/37 R |

*Primary Examiner*—T. M. Tufariello
*Attorney, Agent, or Firm*—Ralf H. Siegemund

[57] ABSTRACT

Copper particles are brushed onto the surface of niobium or niobium alloy strip which is then wound helically on a roll for electroplating a thin copper layer onto the one strip surface. The coated strip is annealed above 900° C for 30 minutes and electrolytic copper plating using again the roll as carrier is continued until the copper layer is sufficiently thick.

7 Claims, 2 Drawing Figures

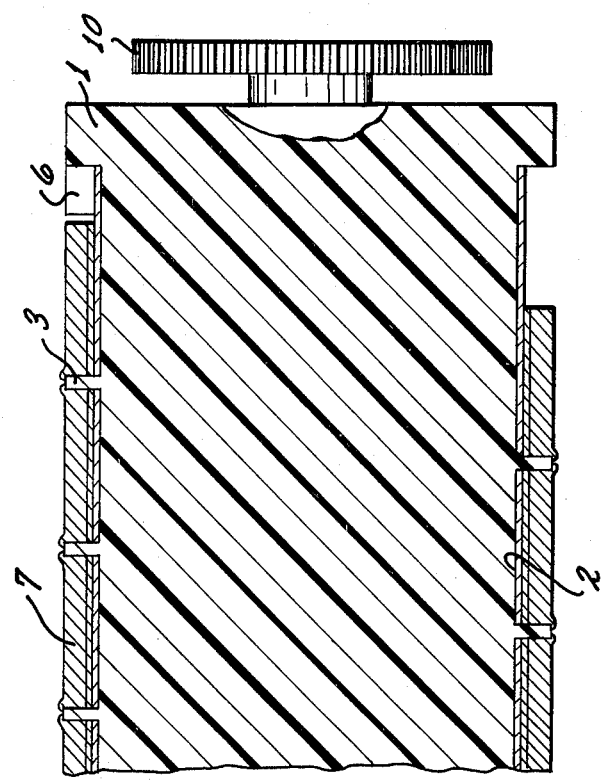
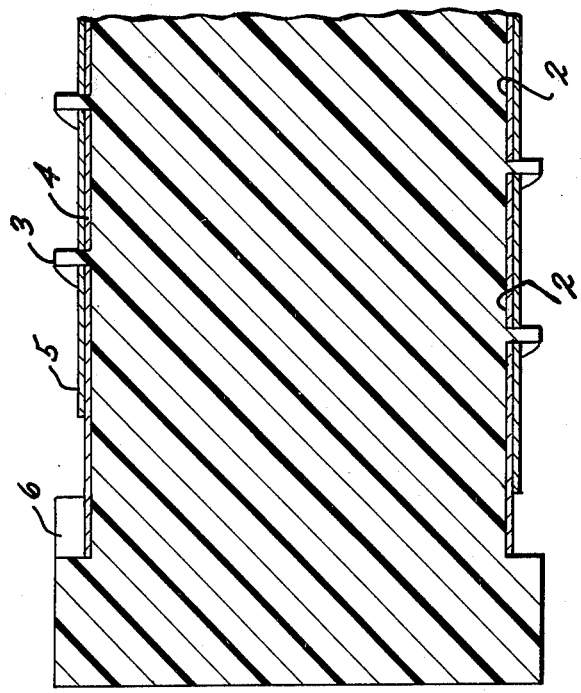

3,974,043

MAKING A STABILIZED SUPERCONDUCTOR

BACKGROUND OF THE INVENTION

The present invention relates to stabilized superconductors and more particularly the invention relates to improvements in the making of superconductors in accordance with U.S. Pat. No. 3,866,315 (Ser. No. 444,568 filed Feb. 21, 1974) of common assignee.

A stabilized superconductor is usually a compound conductor assembly in which a first layer is made of material regarded as being a superconductor and a second, thicker layer is made of a regular conductor so that in the case of failure of the superconductor (e.g. dropout of the cooling medium) current flow can be shifted to the thicker conductor (e.g. copper) at least for a period of time that is sufficient to trigger a circuit breaker.

The above-mentioned patent describes a method for making such a stabilized superconductor, wherein a tape or ribbon of niobium or a niobium alloy is first provided with a copper layer by brushing copper particles into the tape, and subsequently copper is electrolytically deposited onto the tape's surface which was covered by copper particles. The purpose thereof was to enhance the bond between niobium and copper.

DESCRIPTION OF THE INVENTION

It is an object of the present invention to improve the method outlined above!

More particularly, it is an object of the present invention to process further a niobium or niobium alloy tape or ribbon onto which copper particles have been brushed and worked-in.

In accordance with the preferred embodiment of the invention, it is suggested to coil niobium or niobium alloy tape or ribbon and dip it onto an electrolytic bath to obtain a thin copper coating combining with the copper particles and establishing a coherent copper layer. The tape or ribbon is subsequently annealed in vacuum or in a protective gas atmosphere, whereafter the tape or ribbon is coiled again and dipped into an electrolytic bath to continue the electrolytic copper plating until the copper layer is sufficiently thick (e.g. 10 times or more as thick as the niobium strip). The inventive method has the decided advantage that one can copperplate long niobium tapes without encountering any problems of any consequence. The niobium tape, strip or ribbon, when receiving a thin copper coating is still flexible and can be annealed in a relatively small heating chamber. Annealing should be carried out at a temperature of at least 600°C, preferably even above 900°C (but below the melting point of copper) and for at least 30 minutes. Should a defect be observed in the tape after the annealing, one can cut that portion out of the tape and splice the remainder together, e.g. by means of a transverse welding seam. Thus, it may be advisable to inspect or test the coated tape after annealing before continuing with the electrolytic copper plating!

It was found to be of advantage to coil the ribbon on a carrier serving as support. That carrier should rotate in the electrolytic bath. For example, one may use a cylindrical roll or drum with a peripheral, helical ridge, so that shallow grooves are established into which the niobium ribbon is wound. The roll may be made of insulative plastic and a cathodically connected copper foil is wound onto the bottom of the groove, the niobium ribbon being wound on top accordingly, but the loops thereof remain separated by insulative ridges between the grooves.

DESCRIPTION OF THE DRAWING

While the specification concludes with claims particularly pointing out and distinctly claiming the subject matter which is regarded as the invention, it is believed that the invention, the objects and features of the invention and further objects and features of the invention further objects, features and advantages thereof will be better understood from the following description taken in connection with the accompanying drawings in which:

FIGS. 1 and 2, are cross-sections through different ends of a roll with copper and niobium strip wound thereon with FIG. 1 illustrating the "before" and FIG. 2 and the "after" of the inventive process.

Proceeding now to the detailed description of the drawings, the figures shown a cylindrical, roll-like body or drum 1 made of polyvinyl chloride or polyethylene, or any other suitable material, possibly having polyvinyl chloride or polyethylene as outer jacket. The roll 1 has a shallow helical groove 2, separated by ridges 3. These grooves have been cut by turning, milling or the like.

As shown in FIG. 2 only, the roll 1 has a gear 10 at one end by means of which rotation is imparted upon the roll. The roll has retaining flanges at both ends. The bottom of the groove 2 is lined by means of a thin copper foil 4, which may have been a ribbon that was wound under tension onto roll 1 to lodge in the groove. The roll has been turned as the foil 4 was wound. Foil or ribbon 4 may have been bonded e.g. by means of a suitable adhesive to be held in place in the groove, but fastening at the ends may suffice.

In order to practice the method, a niobium or niobium alloy strip, tape or ribbon 5 is surface treated at first as described in the above identified patent. Particularly, copper particles are brushed and worked into one surface side of the strip 5. That strip or tape is now wound onto the roll by placing it into groove 2, simply by fastening one end of strip 5 and causing the roll 1 to rotate. Strip or ribbon 5 has been placed so that the copper particled surface faces in radial outward direction, the rear surface contacts the copper foil 4.

The roll 1 with strips 4 and 5 in place is now dipped into an electrolytic bath for copper plating; the copper tape 4 is electrically connected to cathode potential. Slip or collector rings or brushes 6 at both ends of roll 1 apply the appropriate voltage potential to the copper foil 4, and that foil provides for even current distribution, the current sustaining the electrolysis. The anode is appropriately positioned in the electrolysis tank (not shown).

By way of example, the niobium strip may have a width of 10 mm and a thickness of 0.1 mm. In this first electrolytic treatment, a copper layer of about 0.1 mm thickness is plated on and integrally combines with the copper particles to obtain both a thin, but coherent coating and a positive bond with the niobium. The roll 1 rotates during the coating to ensure even distribution of copper precipitation.

After having plated one side of the niobium strip 5, it is removed from the roll 1 and rewound if necessary on another carrier and annealed in vacuum or in a helium argon atmosphere at about 1000°C and for about 30 minutes. This annealing improves the bond between the precipitated copper and the niobium, because vigorous diffusion accompanies the annealing.

Subsequently, the annealed copper coated niobium stip is again wound on the or a roll 1, whereupon anode potential is applied briefly to tape 4 (which remains in place as part of the equipment), so that any oxide is removed from the copper coating. Again, that coating on ribbon 5 faces radially away to be exposed to the electrolytic bath. Now, copper plating by electrolysis is continued until, for example, a thickness of 3 mm has been obtained. Roll 1 continuously rotates during the process to ensure an even plating process.

The resulting layer may still not be completely even; the edges may be thicker, so that some cutting and stripping may be needed here to even out the thickness of the copper layer. The copperplated niobium strip (which should now more appropriately be called a 3 mm copper strip with a thin (0.1 mm) niobium cover) is now removed, i.e. uncoiled from roll 1 and may now be further processed, e.g. rolled down to increase primarily the length. That resulting strip may then be folded longitudinally into a split tube which is seam-welded along the edges to obtain a stabilized, i.e. combined copper-niobium conductor.

The invention is not limited to the embodiments described above, but all changes and modifications thereof not constituting departures from the spirit and scope of the invention are intended to be included.

We claim:

1. In a method for making a stabilized superconductor, wherein a niobium or niobim alloy strip, tape or ribbon has one of its surfaces treated in that copper particles are brushed on and into that surface, a continuation of that method comprising the steps of electrolytically copper-plating said surface to obtain a thin coating of which said particles become a part; annealing the copper plated strip, tape or ribbon in protective gas or vaccuum; and continuing electrolytically copper plating following the annealing for increasing the thickness of said coating to a substantial degree.

2. In a method as in claim 1, wherein the annealing is carried out at a temperature of more than 600°C, preferably above 900°C and for a duration of at least 30 minutes.

3. In a method as in claim 1, wherein the tape, strip or ribbon is wound on a carrier prior to each copper plating.

4. In a method as in claim 3, wherein the carrier is caused to rotate during the electrolytic plating.

5. In a method as in claim 3, and using a carrier having a helical groove into which the strip, tape or ribbon is wound, and using a copper foil bottom lining for the carrier.

6. In a method as in claim 5, wherein the foil is a copper foil which is electrically connected as cathode.

7. In a method as in claim 5, wherein the grooves are separated by insulative ridges.

* * * * *